HIGH POWER SEMICONDUCTOR DEVICE HAVING A PLURALITY OF EMITTER REGIONS

Filed Jan. 30, 1968

INVENTOR
TERUO NAKATANI
BY
Hopgood & Calimafde
ATTORNEYS

United States Patent Office 3,519,898
Patented July 7, 1970

3,519,898

HIGH POWER SEMICONDUCTOR DEVICE HAVING A PLURALITY OF EMITTER REGIONS

Teruo Nakatani, Tokyo, Japan, assignor to Nippon Electric Company, Limited, Tokyo, Japan
Filed Jan. 30, 1968, Ser. No. 701,627
Claims priority, application Japan, Jan. 31, 1967, 42/6,402
Int. Cl. H01l *11/06*
U.S. Cl. 317—235 4 Claims

ABSTRACT OF THE DISCLOSURE

A semiconductor device having a substrate as the collector region, a base region in the substrate, a plurality of partial emitter regions formed on the base region connected together, and a buffer region within each partial emitter region, said buffer regions having a conductivity type opposite to that of the emitter regions, which makes possible a higher power capability with high stability over a wide operating range.

BACKGROUND OF THE INVENTION

Figure 1:
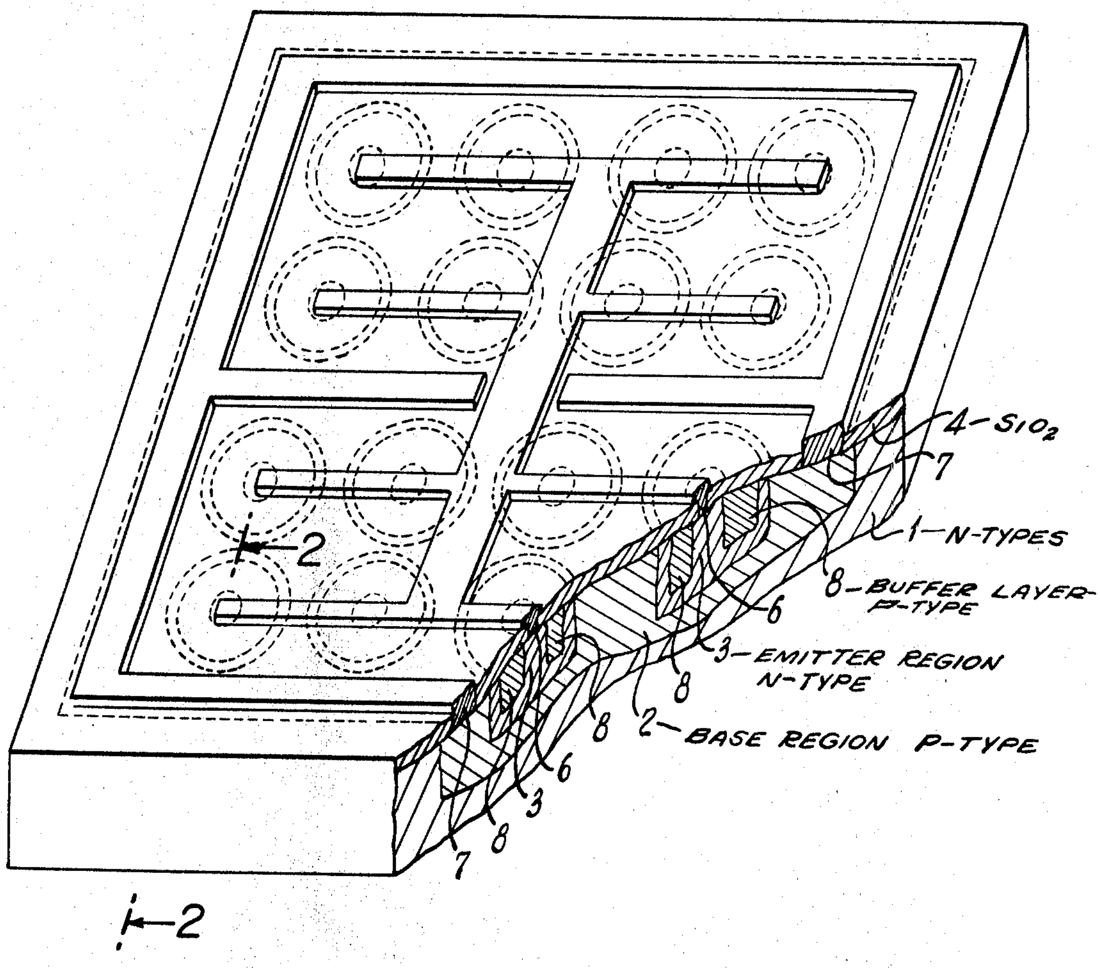

A transistor under condition of excess current operation, usually suffers from a self-biasing effect caused by the base spreading resistance. As a result, the injection of minority carriers is performed in a rather restricted area surrounding the emitter region. In other words, the effective region of the emitter is restricted within the vicinity thereof upon the occurrence of such a phenomenon, causing an excess emitter current concentration or the so-called current hogging to partially or entirely destroy the transistor. As a countermeasure, it has been proposed to lengthen the periphery of the emitter region. In the case of a simple emitter configuration, however, the lengthening of the periphery of the emitter region unavoidably entails an increase in its area, which in turn makes it necessary to enlarge the semiconductor pellet or substrate. This is not only uneconomical, but also disadvantageous for high frequency use. To solve this problem, another proposal has been made, in which many partial emitter regions are separately disposed on a common base layer and externally connected in common to the emitter electrode terminal of the transistor.

However, since such a transistor is structurally equivalent to many transistors combined in parallel, it has the following disadvantages: when a larger electric current is caused to flow in the vicinity of one of the partial emitter regions than in any of the others, this partial emitter region generates more heat than the other emitter regions, which in turn elevates its temperature. On the other hand inasmuch as the temperature coefficient of an emitter current under constant emitter base voltage is positive, greater current is caused to flow through the temperature-elevated partial emitter region, compared with the other partial emitter regions. Since the increased current induces further local temperature elevation, almost all of the emitter current is eventually concentrated in this temperature-elevated partial emitter region, and as a result the transistor is finally destroyed.

In order to obviate such difficulty, the current concentration should be maintained at a rather low current level.

For this purpose, an improved structure has been proposed in which an evaporated resistor layer is formed between respective partial emitter regions and the emitter outlet connection to suppress the excessive current concenration in a specific partial emitter region (See "Electronics Design" vol. 24, page 108, Oct. 25, 1966). With the proposed structure, however, it is very difficult and troublesome to additionally form an additional resistor layer. Also, such a structure is disadvantageous from the viewpoint of reliability, because there is a difference in the thermal expansion coefficient between the semiconductor substrate with insulator film formed thereon, and the heterogeneous resistor layer.

OBJECT OF THE INVENTION

It is an object of this invention to provide an improved semiconductor device capable of preventing excess emitter current concentration and to stabilize its performance over a wide operating range.

SUMMARY OF THE INVENTION

According to this invention a semiconductor device is provided having a semiconductor substrate forming a collector region, a base region formed in said substrate, a plurality of partial emitter regions formed in said base region and externally connected in common to an emitter outlet terminal, and a buffer region formed without any outlet within each of said partial emitter regions, surrounding the contact between said partial emitter region and connected to said emitter outlet terminal, by diffusing into said emitter region a conductivity type impurity opposite to those diffused in said emitter regions to differentiate the buffer region from the emitter in its conductivity type.

In the semiconductor device of this invention, impurities for forming the buffer region are diffused in each of the partial emitter regions. Since these impurities compensate for the impurity forming the emitter regions and raise the specific resistance of the emitter region, the excess emitter current concentration is thus avoided. Furthermore, since the buffer or resistive layer in this semiconductor device can be formed by a diffusion process rather than by an evaporation process, the manufacture of the semi-conductor device as a whole is facilitated and made economical. In addition, when the buffer region is opposite to the emitter region in its conductivity type, the junction between the emitter and buffer regions is a PN junction. Consequently in such a case a sufficiently high resistance is provided for the emitter current flowing from the base-emitter junction to the emitter electrode. In other words, the PN junction further facilitates the prevention of excess emitter current concentration.

The abovementioned and other features and objects of this invention and the manner of attaining them will become more apparent and the invention itself will best be understood by reference to the following description of an embodiment of the invention taken in conjunction with the accompanying drawings, the description of which follows.

Figure 2:
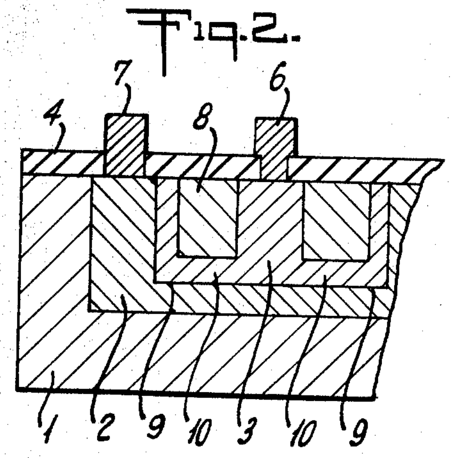

FIG. 1 is a perspective view of an embodiment of this invention, with a part of it cut away; and FIG. 2 shows a cross section of a part of the embodiment observed along line 2—2 in the direction of arrows shown in FIG. 1.

DETAILED DESCRIPTION OF THE INVENTION

An embodiment of this invention, shown in FIGS. 1 and 2, is manufactured by the following process: An n-type silicon substrate 1 covered with a silicon dioxide film 4 is photo-etched to provide a desired aperture in the film. A p-type impurity, such as boron, is then diffused through the aperture into the substrate 1 to form a p-type base region 2. The exposed area on the substrate 1 is then oxidized to entirely cover it again with a silicon dioxide film 4, which is thereafter removed in the shape of separate circles as shown, for forming partial emitter regions. Next, an n-type impurity, for example, phosphorus, is diffused from these circular exposed silicon surface portions to form a plurality of n-type partial emitter regions 3. The emitter surface is then oxidized to entirely cover it with the silicon dioxide film 4, portions of which are then removed in the shape of separate rings surrounding the centers of respective partial emitter regions. A p-type impurity, such as boron, is then diffused from the exposed emitter surface to form the respective buffer layer 8 of conductivity type opposite to the emitter region 3. The buffer region is formed solely within the partial emitter region in the manner shown i.e. the buffer region does not extend beyond the limits of the emitter region or, needless to say, beyond the top surface of the substrate. The exposed surface of the p-type layer 8 is again oxidized to totally cover the same with the silicon dioxide film 4. The portion of the film 4 covering the upper end surfaces of the base and emitter regions is then removed, and emitter and base electrodes 6 and 7 are provided for these regions by the well-known aluminum evaporation process.

The buffer region 8 of the conductivity type opposite to the emitter region 3 brings about the following effect on the emitter current distribution: In general, an n-type impurity concentration forming the emitter region decreases according to complementary error function of the distance from the surface. Therefore, also in the present device, the specific resistance of the region 3 decreases in proportion to the distance from base-emitter junction 9, because the impurity concentration increases in proportion to the same distance. In the present device, however, the relatively-high-resistance region 8 provides sufficient resistance for electric current flowing from the junction 9 through emitter region 3 to emitter electrode 6. As a result, even when the entire emitter electric current tends to concentrate on a single or several partial emitter regions, electric potential difference between the base-emitter junction and emitter electrodes can be maintained at a high value as compared with the conventional device without the region corresponding to region 8. This enables to lower the base-emitter junction voltage. For this reason, it is possible to compensate for the increase in emitter current, and consequently to avoid the excess emitter current concentration. On the other hand, since entire surface of the n-type buffer region 8 is entirely covered with silicon dioxide and has no direct connection with any one of emitter base and collector electrodes, it does not affect the properties of the transistor at all. The effects of the region 8 can be enhanced by making its diffusion depth greater making such a transistor suitable for high power use. It should be noted that the present invention has made it possible to provide transistors to improved reliability for high power and high frequency use, by the addition of only one selective diffusion process for producing buffer region 8.

As will be understood from the above description when the region 8 is given a conductivity type opposite to the emitter region 3, an additional electrode may be attached for supplying the emitter-buffer junction with backward-biasing voltage so as to raise the effective resistance of the region 8. Also, the collector region 1 may be a region formed in a large substrate of an integrated circuit.

What is claimed is:

1. In a high power semiconductor device having a semiconductor substrate forming a collector region, a base region formed in said substrate, a plurality of partial emitter regions formed in said base region and externally connected in common to an emitter outlet terminal, the improvement characterized in that each of said emitter regions comprises a highly-resistive passive buffer region formed solely within said emitter region of an impurity of a conductivity type opposite to that in said emitter region.

2. A semiconductor device claimed in claim 1, wherein said buffer region is annular shaped and surrounds the connection between said partial emitter region and said emitter outlet terminal.

3. A semiconductor device claimed in claim 2, wherein the emitter region adjacent said base region is annular and surrounds said buffer region, the said emitter region being surrounded by said buffer region being concentric thereto.

4. A semiconductor device claimed in claim 3, wherein said annular emitter portion is integrally connected to said concentric emitter portion.

References Cited

UNITED STATES PATENTS

| | | | |
|---|---|---|---|
| 3,022,568 | 2/1962 | Nelson et al. | 29—25.3 |
| 3,309,537 | 3/1967 | Archer | 307—88.5 |
| 3,379,584 | 4/1968 | Bean et al. | 148—175 |
| 3,427,511 | 2/1969 | Rosenzweig | 317—235 |
| 3,430,110 | 2/1969 | Goshgarian | 317—234 |

JERRY D. CRAIG, Primary Examiner